United States Patent
Lei et al.

(10) Patent No.: US 12,019,117 B2
(45) Date of Patent: Jun. 25, 2024

(54) CHIP AND CHIP TEST METHOD

(71) Applicant: Shanghai Biren Technology Co.,Ltd, Shanghai (CN)

(72) Inventors: Kai Lei, Shanghai (CN); Yikai Liang, Shanghai (CN); Yudan Deng, Shanghai (CN); Linglan Zhang, Shanghai (CN); Jinfu Ye, Shanghai (CN); Huan Liu, Shanghai (CN)

(73) Assignee: Shanghai Biren Technology Co., Ltd, Shanghai (CN)

( * ) Notice: Subject to any disclaimer, the term of this patent is extended or adjusted under 35 U.S.C. 154(b) by 191 days.

(21) Appl. No.: 17/888,491

(22) Filed: Aug. 16, 2022

(65) Prior Publication Data

US 2023/0176118 A1   Jun. 8, 2023

(30) Foreign Application Priority Data

Dec. 3, 2021   (CN) .......................... 202111461773.6

(51) Int. Cl.
  *H03M 1/66* (2006.01)
  *G01R 31/317* (2006.01)
  *G01R 31/3187* (2006.01)

(52) U.S. Cl.
  CPC .... *G01R 31/31703* (2013.01); *G01R 31/3187* (2013.01)

(58) Field of Classification Search
  CPC .................. G01R 31/31703; G01R 31/3187
  See application file for complete search history.

(56) References Cited

U.S. PATENT DOCUMENTS

| | | | |
|---|---|---|---|
| 2009/0167337 A1 | 7/2009 | Yamane et al. | |
| 2020/0233039 A1 | 7/2020 | Jorgensen et al. | |
| 2021/0011505 A1* | 1/2021 | Chien | G05F 1/575 |
| 2021/0058092 A1* | 2/2021 | Reay | G05F 3/08 |

FOREIGN PATENT DOCUMENTS

| | | |
|---|---|---|
| CN | 111025132 | 4/2020 |
| CN | 112957026 | 6/2021 |
| TW | 201802795 | 1/2018 |

OTHER PUBLICATIONS

"Office Action of Taiwan Counterpart Application", issued on Oct. 31, 2022, p. 1-p. 4.

* cited by examiner

*Primary Examiner* — Alesa Allgood
(74) *Attorney, Agent, or Firm* — JCIP GLOBAL INC.

(57) ABSTRACT

A chip and a chip test method are provided. The chip includes a receiver circuit and a test circuit. The receiver circuit includes a signal receiving unit and a signal bump. The signal bump is coupled to the signal receiving unit. The test circuit is coupled to a circuit node between the signal receiving unit and the signal bump. The test circuit includes a digital-to-analog converter, a first resistor, and a unit gain buffer. A first terminal of the first resistor is coupled to the circuit node. An output terminal of the unit gain buffer is coupled to a second terminal of the first resistor. A first input terminal of the unit gain buffer is coupled to an output terminal of the digital-to-analog converter. A second input terminal of the unit gain buffer is coupled to an output terminal of the unit gain buffer.

20 Claims, 9 Drawing Sheets

CHIP AND CHIP TEST METHOD

CROSS-REFERENCE TO RELATED APPLICATION

This application claims the priority benefit of China application serial no. 202111461773.6, filed on Dec. 3, 2021. The entirety of the above-mentioned patent application is hereby incorporated by reference herein and made a part of this specification.

BACKGROUND

Technical Field

The disclosure relates to a test technology, and in particular, to a chip and a chip test method.

Description of Related Art

As the computational requirements for chips grow, the bandwidth and latency requirements for a system on a chip (SOC) increase, and the speed of the serializer/deserializer (SERDES) protocol is also required to be accelerated. In this regard, in a conventional chip, a signal bump with a large area is required be designed at the receiver of the chip to meet the requirements of design for testability (DFT) in the manufacturing process of the high-speed chip, so as to allow the related electrical testing to be performed. It thus can be seen that in a conventional chip, the receiver circuit usually occupies a large area of the signal bumps. The circuit space may thus be wasted, and the influence caused by parasitic capacitance may also be significant.

SUMMARY

The disclosure provides a chip and a chip test method through which effective electrical testing at a signal receiver of the chip may be achieved.

The disclosure provides a chip including a receiver circuit and a test circuit. The receiver circuit includes a signal receiving unit and a signal bump. The signal bump is coupled to the signal receiving unit. The test circuit is coupled to a circuit node between the signal receiving unit and the signal bump. The test circuit includes a digital-to-analog converter, a first resistor, and a unit gain buffer. A first terminal of the first resistor is coupled to the circuit node. An output terminal of the unit gain buffer is coupled to a second terminal of the first resistor. A first input terminal of the unit gain buffer is coupled to an output terminal of the digital-to-analog converter. A second input terminal of the unit gain buffer is coupled to an output terminal of the unit gain buffer.

The disclosure further provides a chip test method suitable for chip testing. The chip includes a receiver circuit and a test circuit. The receiver circuit includes a signal receiving unit and a signal bump. The signal receiving unit is coupled to the signal bump. The test circuit is coupled to a circuit node between the signal receiving unit and the signal bump. The test circuit includes an analog-to-digital converter, a first resistor, and a unit gain buffer. A first terminal of the first resistor is coupled to the circuit node. An output terminal of the unit gain buffer is coupled to a second terminal of the first resistor. A first input terminal of the unit gain buffer is coupled to an output terminal of the analog-to-digital converter. A second input terminal of the unit gain buffer is coupled to an output terminal of the unit gain buffer. The chip test method includes the following steps. When an input terminal of the analog-to-digital converter receives a digital test signal, the output terminal of the analog-to-digital converter outputs a first direct current (DC) level test signal to the first input terminal of the unit gain buffer. The output terminal of the unit gain buffer outputs a second DC level test signal. The signal receiving unit receives the second DC level test signal through the circuit node.

To sum up, in the chip and the chip test method provided by the disclosure, the test circuit may be arranged to be disposed at the signal receiver in the chip, and effective electrical testing at the signal receiver may be achieved in this way.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
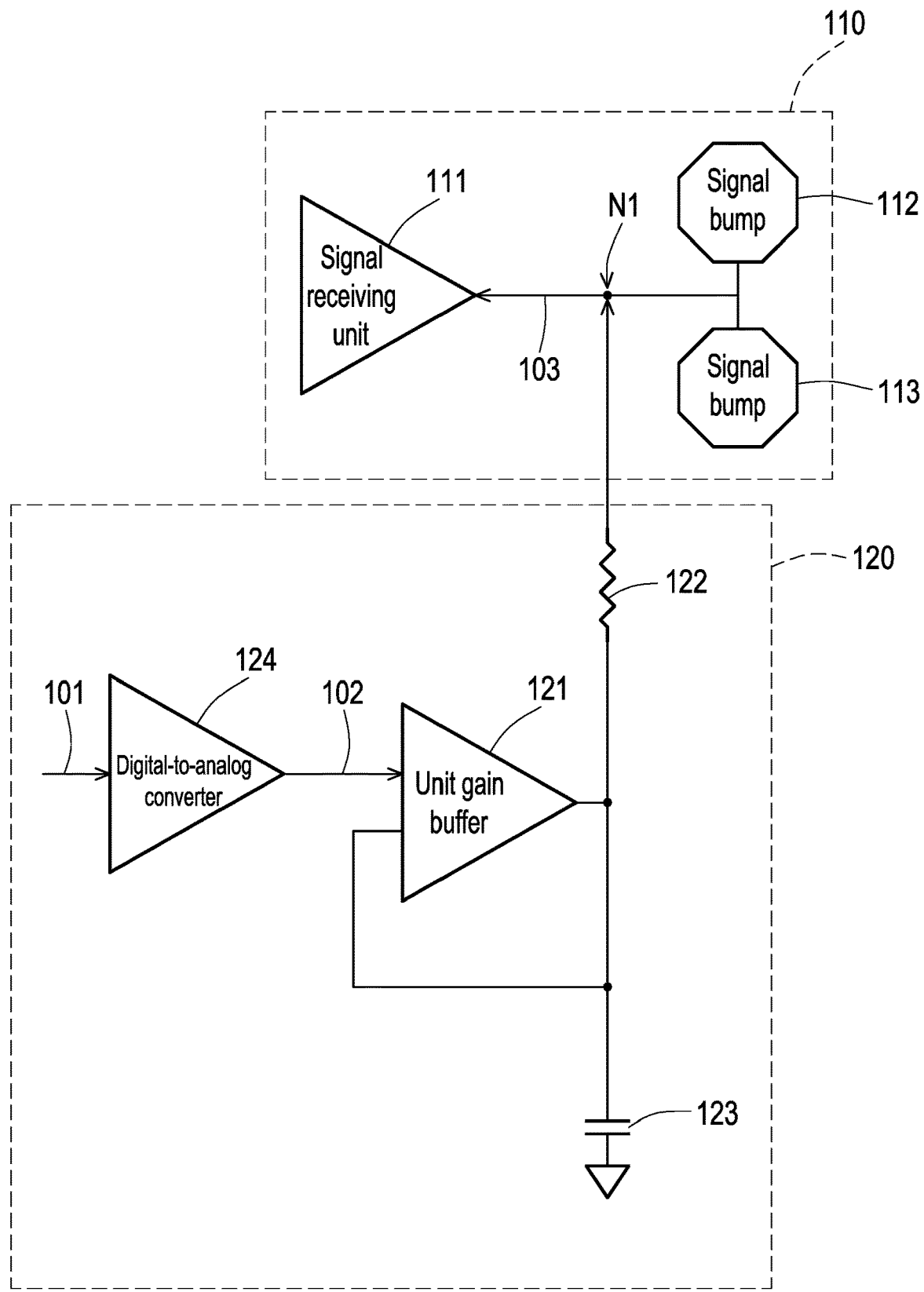
FIG. 1 is a schematic circuit diagram of a chip according to a first embodiment of the Disclosure.

Description of the disclosure is given with reference to the exemplary embodiments illustrated by the accompanying drawings. Wherever possible, the same reference numbers are used in the drawings and the description to refer to the same or like parts.

FIG. 1 is a schematic circuit diagram of a chip according to a first embodiment of the disclosure. With reference to FIG. 1, a chip 100 includes a receiver circuit 110 and a test circuit 120. The test circuit 120 may perform electrical testing on the receiver circuit 110. In this embodiment, the receiver circuit 110 includes a signal receiving unit 111 and signal bumps 112 and 113. The signal receiving unit 111 is coupled to the signal bumps 112 and 113. In some embodiments of the disclosure, the receiver circuit 110 may include one signal bump or a plurality of signal bumps, and it is not limited to what is shown in FIG. 1. In this embodiment, the test circuit 120 is coupled to a circuit node N1 between the signal receiving unit 111 and the signal bumps 112 and 113. The test circuit 120 includes a unit gain buffer 121 (or referred to as a voltage follower), a first resistor 122, a capacitor 123, and a digital-to-analog converter (DAC) 124. A first terminal of the first resistor 122 is coupled to the circuit node N1. An output terminal of the unit gain buffer 121 is coupled to a second terminal of the first resistor 122. A first input terminal of the unit gain buffer 121 is coupled to an output terminal of the digital-to-analog converter 124. A second input terminal of the unit gain buffer 121 is coupled to the output terminal of the unit gain buffer 121. A first terminal of the capacitor 123 is coupled to the second terminal of the first resistor 122. A second terminal of the capacitor 123 is coupled to a reference voltage (e.g., a ground terminal voltage).

In this embodiment, the first resistor 122 may be a large resistor, for example, having 1K ohm. The first resistor 122 may be used to isolate the receiver circuit 110 and the test circuit 120. The capacitor 123 may filter a signal transmitted from the test circuit 120 to the circuit node N1 of the receiver circuit 120 to filter out noise. In this embodiment, the test circuit 120 may operate in a direct current (DC) level test mode, so as to send a first DC level test signal to the signal receiving unit 111 of the receiver circuit 110, so that the signal receiving unit 111 may generate a corresponding test signal for analysis by a related processing circuit in the chip 100 or an external signal test apparatus.

Figure 2:
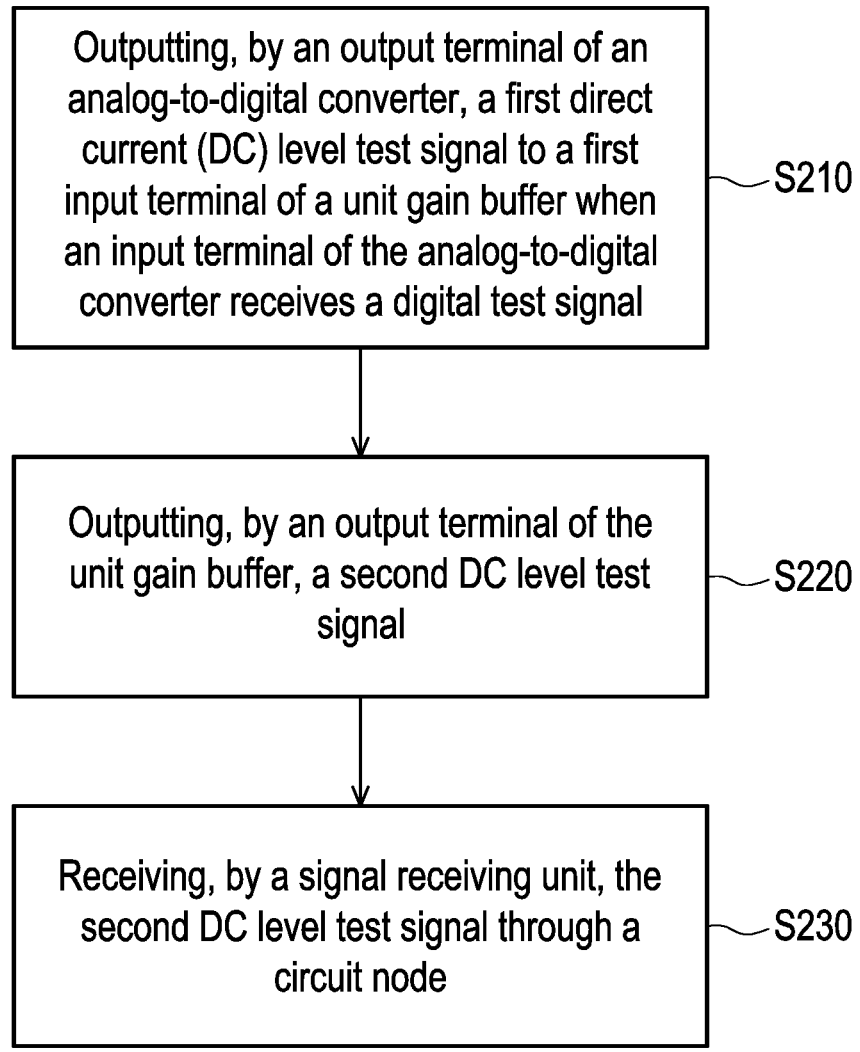
FIG. 2 is a flow chart of a chip test method according to the first embodiment of the disclosure.

FIG. 2 is a flow chart of a chip test method according to the first embodiment of the disclosure. With reference to FIG. 1 and FIG. 2, the chip 100 may perform the following steps S210 to S230 to achieve DC level testing. In step S210, when an input terminal of the analog-to-digital converter 124 receives a digital test signal 101 (determining a DC level for testing) outputting, the output terminal of the analog-to-digital converter 124 outputs a first DC level test signal 102 to the first input terminal of the unit gain buffer 121. In this embodiment, the first DC level test signal 102 is an analog signal. In step S220, an output terminal of the unit gain buffer 121 outputs a second DC level test signal 103 (voltage signal). Herein, the output terminal of the rail-to-rail unit gain buffer 121 may output the second DC level test signal 103 exhibiting low noise and good linearity characteristics. In step S230, the signal receiving unit 111 receives the second direct current level test signal 103 through the circuit node N1. In this embodiment, a related processing circuit in the chip 100 or an external signal test apparatus is used herein to analyze the second DC level test signal 103, so as to obtain an electrical test result related to the DC level signal of the receiver circuit 110 of the chip 100.

In addition, in some embodiments of the disclosure, in a DC level test mode, the signal receiving unit 111 may be configured to receive a differential signal. In other words, the signal receiving unit 111 may include a first input terminal and a second input terminal. The first input terminal of the signal receiving unit 111 may be coupled to the signal bumps 112 and 113 through the circuit node N1, and the second input terminal of the signal receiving unit 111 is coupled to at least another signal bump through another circuit node. The chip 100 may further include another test circuit (having the same circuit configuration as the test circuit 120), and the another test circuit is coupled to the another circuit node. In this way, the first output terminal and the second output terminal of the signal receiving unit 111 may receive the differential test signals provided by different test circuits to perform the DC level test separately.

Figure 3:
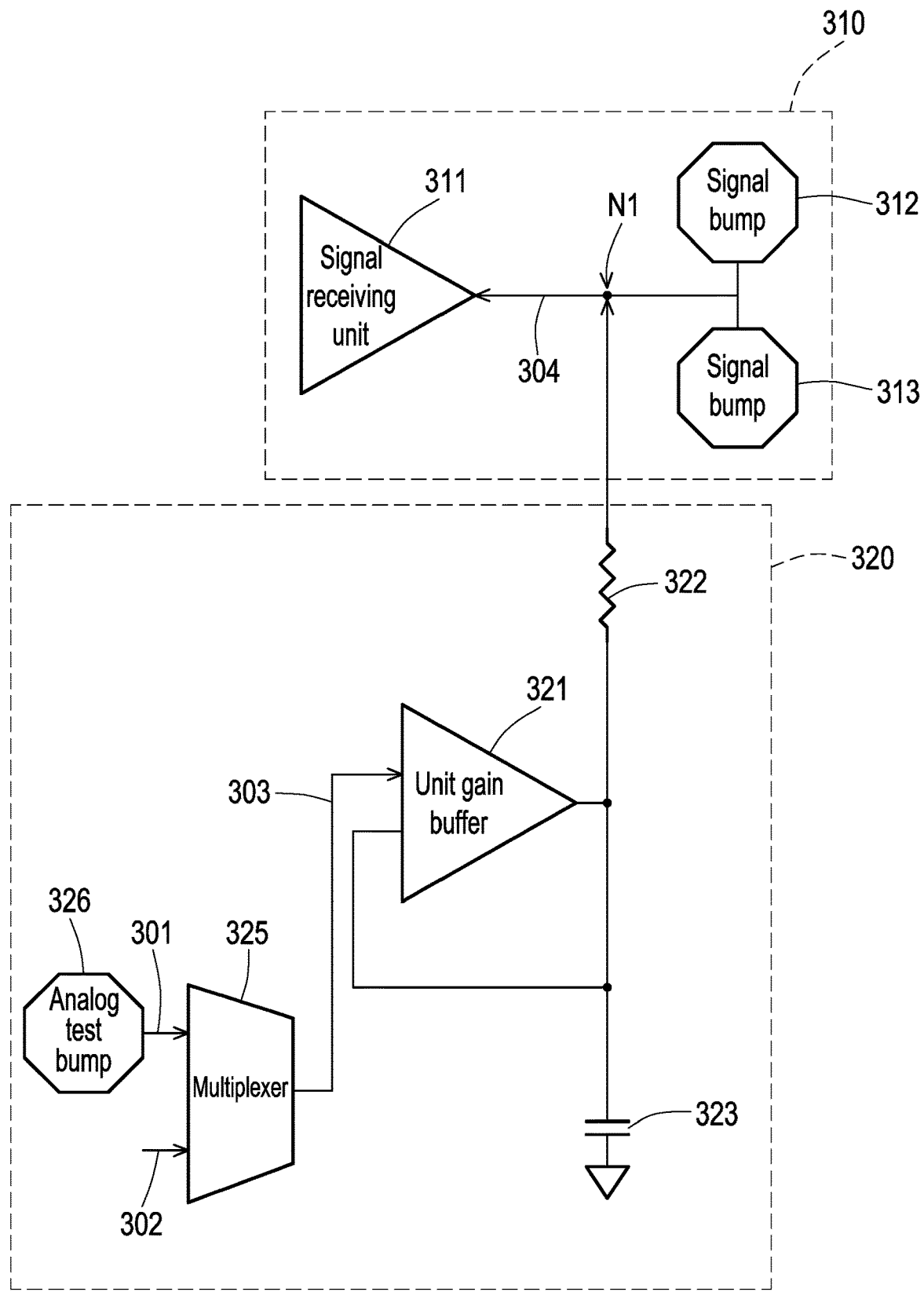
FIG. 3 is a schematic circuit diagram of a chip according to a second embodiment of the disclosure.

FIG. 3 is a schematic circuit diagram of a chip according to a second embodiment of the disclosure. With reference to FIG. 3, a chip 300 includes a receiver circuit 310 and a test circuit 320. The test circuit 320 may perform electrical testing on the receiver circuit 310. In this embodiment, the receiver circuit 310 includes a signal receiving unit 311 and signal bumps 312 and 313. The signal receiving unit 311 is coupled to the signal bumps 312 and 313. In some embodiments of the disclosure, the receiver circuit 310 may include one signal bump or a plurality of signal bumps, and it is not limited to what is shown in FIG. 3. In this embodiment, the test circuit 320 is coupled to a circuit node N1 between the signal receiving unit 311 and the signal bumps 312 and 313. The test circuit 320 includes a unit gain buffer 321, a first resistor 322, a capacitor 323, a multiplexer (MUX) 325, and an analog test bump 326. An output terminal of the multiplexer 325 is coupled to a first input terminal of the unit gain buffer 321. A first input terminal of the multiplexer 325 is coupled to the analog test bump 326, so as to receive a receiver analog test signal 301 provided by an external test signal generation device through the analog test bump 326. A second input terminal of the multiplexer 325 receives a transmitter analog test signal 302.

In this embodiment, the multiplexer 325 determines to output the receiver analog test signal 301 or the transmitter analog test signal 302 to act as a first analog test signal 303 according to a switching signal. An output terminal of the unit gain buffer 321 outputs a second analog test signal 304. The signal receiving unit 311 receives the second analog test signal 304 through the circuit node N1. In other words, in this embodiment, the test circuit 320 may test the receiver circuit 310 according to the receiver analog test signal 301 provided by the external test signal generation device of the chip 300. Alternatively, in this embodiment, the test circuit 320 may output transmitter analog test signal 302 according to an output terminal of the chip 300 and tests the receiver circuit 310 after external loopback.

In some other embodiments of the disclosure, the test circuit may not have to include the multiplexer 325 and the analog test bump 326, but may receive the first analog test signal 303 directly through the first input terminal of the unit gain buffer 321.

In this embodiment, some circuit elements in the receiver circuit 310 and the test circuit 320 are the same as those in FIG. 1, so that description of these circuit elements may be found with reference to the description of the embodiments of FIG. 1 and thus is not repeated herein. In this embodiment, the test circuit 320 may operate in an analog signal test mode, so as to receive the receiver analog test signal 301 generated by a test signal generation circuit in the chip 300 or to receive the transmitter analog test signal 302 outputted through the output terminal of the chip 300, and may generate a corresponding test signal for analysis by a related processing circuit in the chip 300. It should be noted that the receiver analog test signal 301 and the transmitter analog test signal 302 described in this embodiment may be low-speed CMOS signals.

Figure 4:
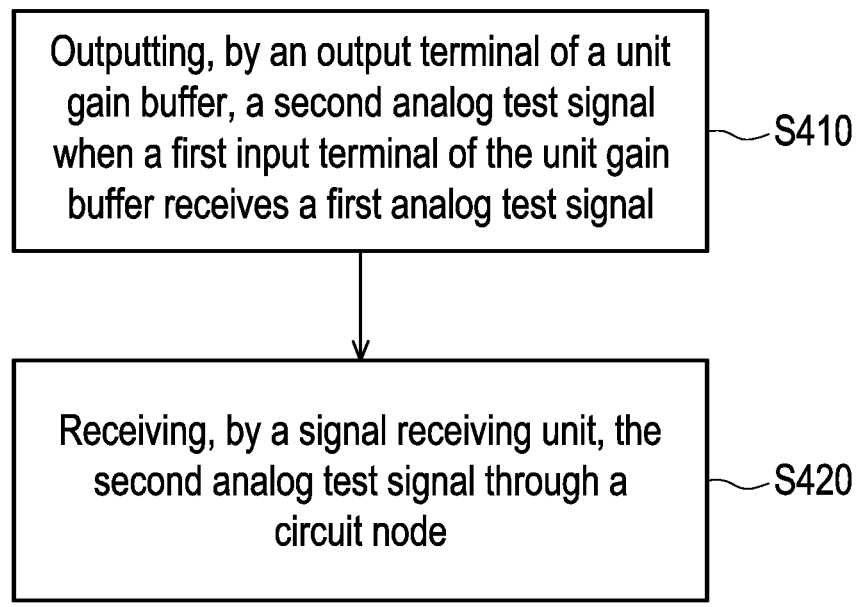
FIG. 4 is a flow chart of a chip test method according to the second embodiment of the disclosure.

FIG. 4 is a flow chart of a chip test method according to the second embodiment of the disclosure. With reference to FIG. 3 and FIG. 4, the chip 300 may perform the following steps S410 to S420 to achieve low-speed CMOS signal testing. The multiplexer 325 determines to output the receiver analog test signal 301 or the transmitter analog test signal 302 to act as the first analog test signal 303 according to the switching signal. In step S410, when the first input terminal of the unit gain buffer 321 receives the first analog test signal 303, the output terminal of the unit gain buffer 321 outputs the second analog test signal 304. Herein, the output terminal of the rail-to-rail unit gain buffer 321 may output the second analog test signal 304 exhibiting low noise and good linearity characteristics. In step S420, the signal receiving unit 311 receives the second analog test signal 304 through the circuit node N1. In this embodiment, the signal receiving unit 311 may receive the second analog test signal 304 for signal analysis, so as to obtain an electrical test result related to the analog signal of the receiver circuit 310 of the chip 300.

In addition, in some embodiments of the disclosure, in the analog signal test mode, the signal receiving unit 311 may be configured to receive a differential signal. In other words, the signal receiving unit 311 may include a first input terminal and a second input terminal. The first input terminal of the signal receiving unit 311 may be coupled to the signal bumps 312 and 313 through the circuit node N1, and the second input terminal of the signal receiving unit 311 is coupled to at least another signal bump through another circuit node. The chip 300 may further include another test circuit (having the same circuit configuration as the test circuit 320), and the another test circuit is coupled to the another circuit node. In this way, the first input terminal and the second input terminal of the signal receiving unit 311 may receive a differential test signal, and the analog signal testing may be separately performed by using different test circuits.

Figure 5:
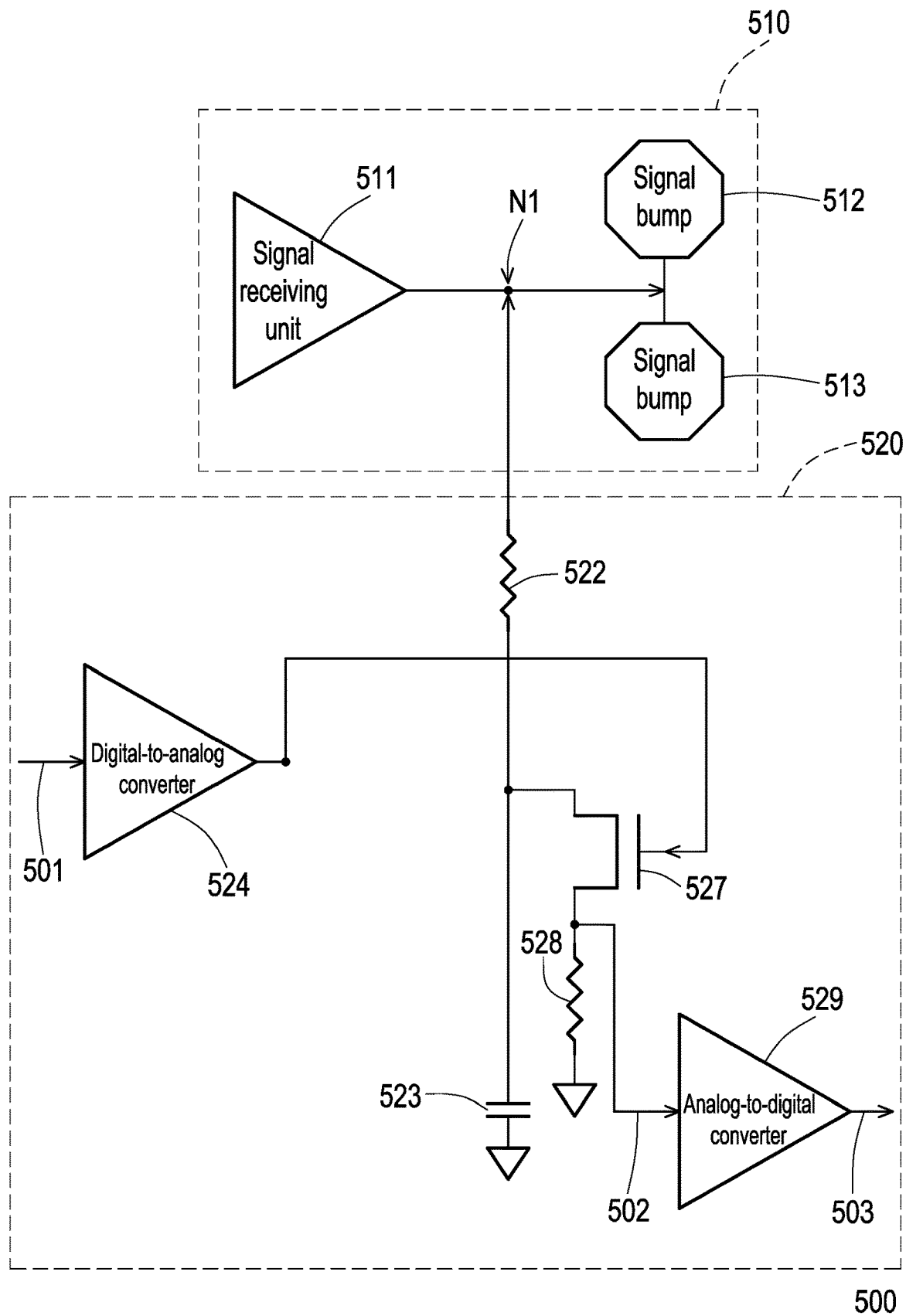
FIG. 5 is a schematic circuit diagram of a chip according to a third embodiment of the disclosure.

FIG. 5 is a schematic circuit diagram of a chip according to a third embodiment of the disclosure With reference to FIG. 5, a chip 500 includes a receiver circuit 510 and a test circuit 520. The test circuit 520 may perform electrical testing on the receiver circuit 510. In this embodiment, the receiver circuit 510 includes a signal receiving unit 511 and signal bumps 512 and 513. The signal receiving unit 511 may include a driver circuit. The signal receiving unit 511 is coupled to the signal bumps 512 and 513. In some embodiments of the disclosure, the receiver circuit 510 may include one signal bump or a plurality of signal bumps, and it is not limited to what is shown in FIG. 5. In this embodiment, the test circuit 520 is coupled to a circuit node N1 between the signal receiving unit 511 and the signal bumps 512 and 513. The test circuit 520 includes a first resistor 522, a capacitor 523, a digital-to-analog converter 524, a switch circuit 527, a second resistor 528, and an analog-to-digital converter 529. A first terminal of the first resistor 522 is coupled to the circuit node N1. A first terminal of the switch circuit 527 is coupled to a second terminal of the first resistor 522. A control terminal of the switch circuit 527 is coupled to an output terminal of the digital-to-analog converter 524. A first terminal of the second resistor 528 is coupled to a second terminal of the switch circuit 527. A second terminal of the second resistor 528 is coupled to the reference voltage (e.g., the ground terminal voltage). An input terminal of the analog-to-digital converter 529 is coupled to the first terminal of the second resistor 528. The switch circuit 527 may be a switch transistor, but the disclosure is not limited thereto.

In this embodiment, some circuit elements in the receiver circuit 510 and the test circuit 520 are the same as those in FIG. 1, so that description of these circuit elements may be found with reference to the description of the embodiments of FIG. 1 and thus is not repeated herein. In this embodiment, the test circuit 520 may operate in the leakage current test mode, so as to detect a leakage current generated by the receiver circuit 510 and to generate a corresponding test signal for analysis by a related processing circuit in the chip 500 or an external signal test device.

Figure 6:
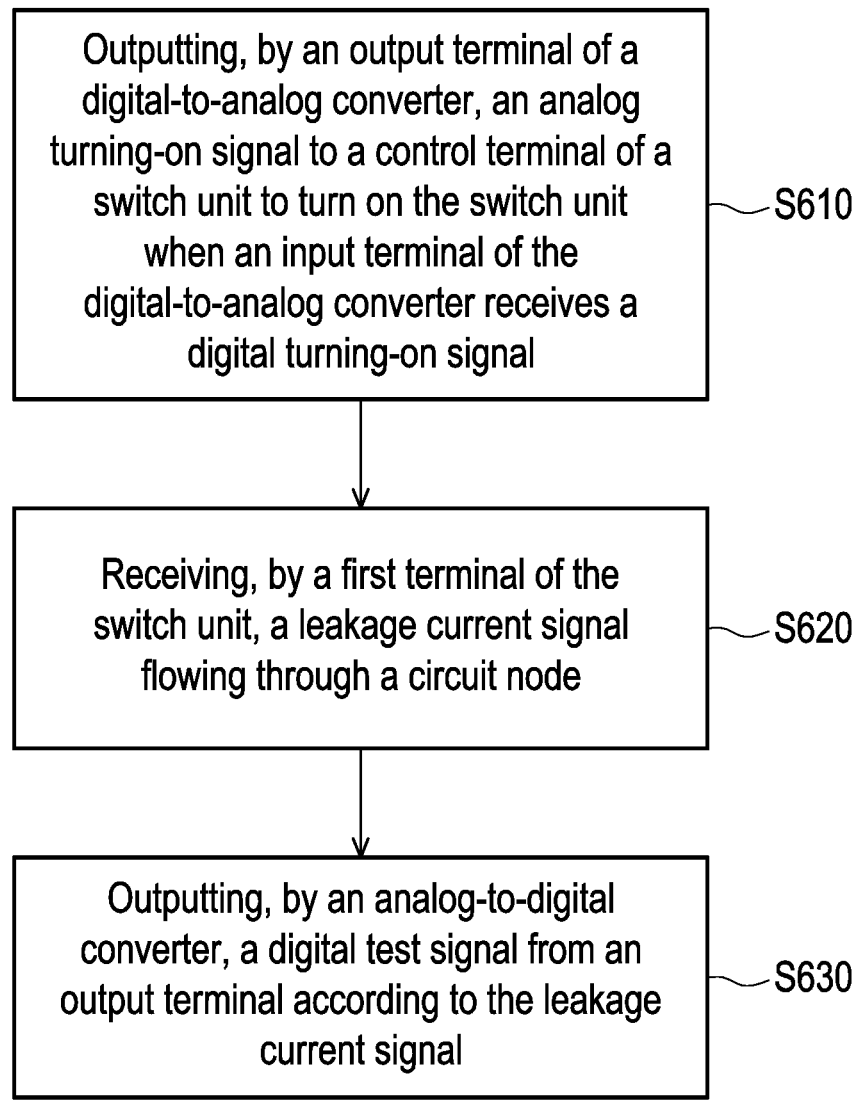
FIG. 6 is a flow chart of a chip test method according to the third embodiment of the disclosure.

FIG. 6 is a flow chart of a chip test method according to the third embodiment of the disclosure. With reference to FIG. 5 and FIG. 6, the chip 500 may perform the following steps S610 to S630 to achieve leakage current testing. In step S610, when an input terminal of the digital-to-analog converter 524 receives a digital turning-on signal 501, the output terminal of the digital-to-analog converter 524 outputs an analog turning-on signal to the control terminal of the switch circuit 527 to turn on the switch circuit 527. Further, when a leakage current occurs in the signal receiving unit 511, the analog-to-digital converter 529 may receive a leakage current signal 502. The leakage current signal 502 refers to a cross-voltage result generated by a leakage current flowing through the switch circuit 527 and the second resistor 528 on the second resistor 528. The leakage current signal 502 is a signal of a voltage value representing the magnitude of the leakage current. In step S620, the first terminal of the switch circuit 527 receives the leakage current signal 502 flowing through the circuit node N1. In step S630, the analog-to-digital converter 529 outputs a digital test signal 503 from an output terminal according to the leakage current signal 502. In this embodiment, the analog-to-digital converter 524 may convert the analog leakage current signal 502 into the digital test signal 503, so that the related processing circuit in the chip 500 or the external signal test apparatus may analyze the digital test signal 503, so as to obtain an electrical test result related to the leakage current of the receiver circuit 510 of the chip 500.

Note that the digital test signal 503 is a reading outputted by the analog-to-digital converter 524, which may be a voltage value. Therefore, the leakage value may be obtained by dividing the voltage value by a resistance value of the second resistor 528.

In addition, in some embodiments of the disclosure, in the leakage current test mode, the signal receiving unit 511 may be configured to receive a common mode test signal. In other words, the signal receiving unit 511 may include a first input terminal and a second input terminal. The first input terminal of the signal receiving unit 511 may be coupled to the signal bumps 512 and 513 through the circuit node N1, and the second input terminal of the signal receiving unit 511 is coupled to at least another signal bump through another circuit node. The chip 500 may further include another test circuit (having the same circuit configuration as the test circuit 520), and the another test circuit is coupled to the another circuit node. In this way, the first input terminal and the second input terminal of the signal receiving unit 511 may input a common mode test signal, and the leakage current testing may be separately performed through different test circuits.

Figure 7:
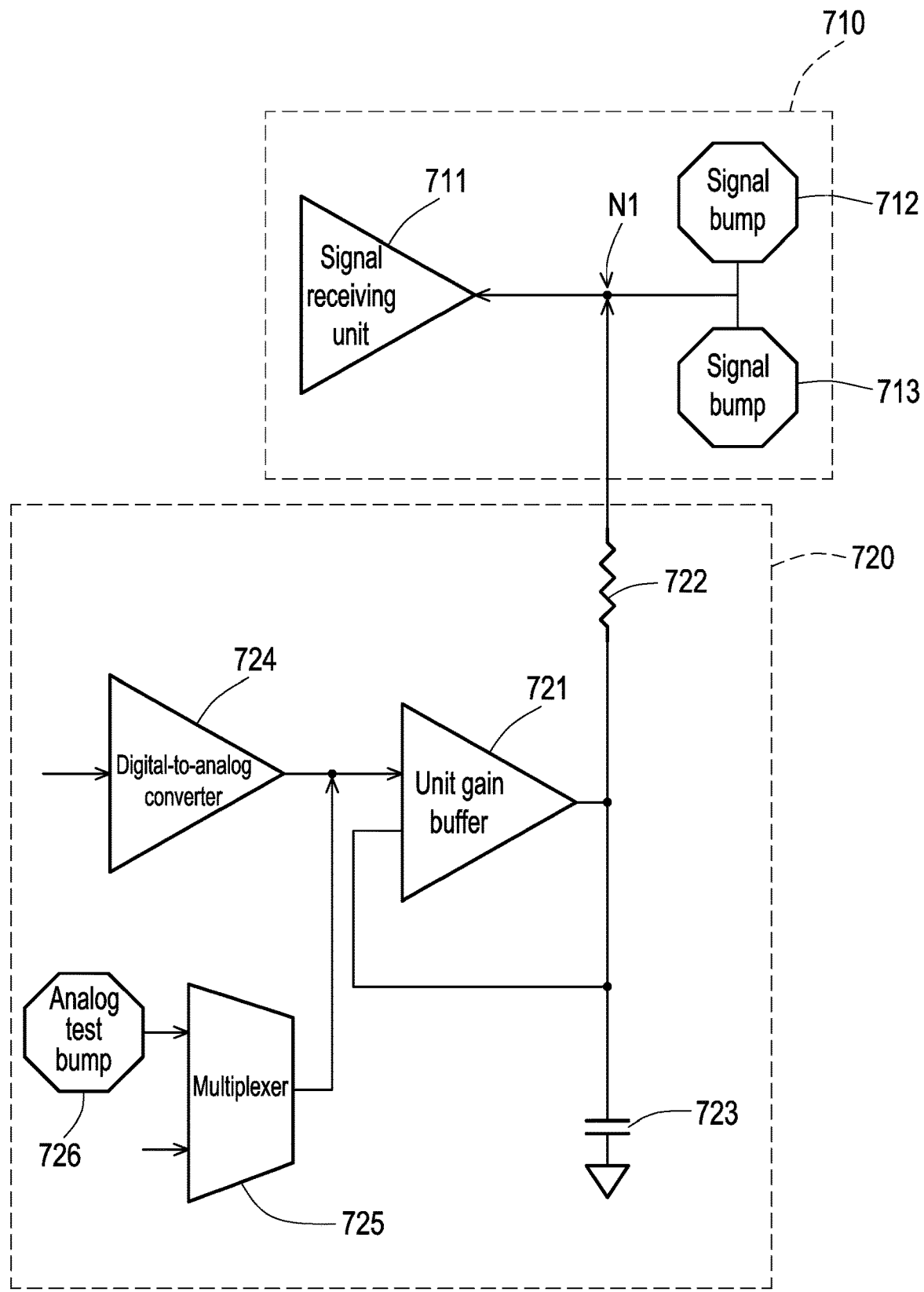
FIG. 7 is a schematic circuit diagram of a chip according to a fourth embodiment of the disclosure.

FIG. 7 is a schematic circuit diagram of a chip according to a fourth embodiment of the disclosure With reference to FIG. 7, a chip 700 includes a receiver circuit 710 and a test circuit 720. The test circuit 720 may perform electrical testing on the receiver circuit 710. In this embodiment, the receiver circuit 710 includes a signal sending unit 711 and signal bumps 712 and 713. The signal receiving unit 711 is coupled to the signal bumps 712 and 713. In some embodiments of the disclosure, the receiver circuit 710 may include one signal bump or a plurality of signal bumps, and it is not limited to what is shown in FIG. 7. In this embodiment, the test circuit 720 is coupled to a circuit node N1 between the signal receiving unit 711 and the signal bumps 712 and 713. The test circuit 720 includes a unit gain buffer 721, a first resistor 722, a capacitor 723, a digital-to-analog converter 724, a multiplexer 725, and an analog test bump 726. A first terminal of the first resistor 722 is coupled to the circuit node N1. An output terminal of the unit gain buffer 721 is coupled to a second terminal of the first resistor 722. A first input terminal of the unit gain buffer 721 is coupled to an output terminal of the digital-to-analog converter 724. A second input terminal of the unit gain buffer 721 is coupled to the output terminal of the unit gain buffer 721. A first terminal of the capacitor 723 is coupled to the second terminal of the first resistor 722. A second terminal of the capacitor 723 is coupled to the reference voltage (e.g., the ground terminal voltage). An output terminal of the multiplexer 725 is coupled to the first input terminal of the unit gain buffer 721. A first input terminal of the multiplexer 725 is coupled to the analog test bump 726, so as to receive a receiver analog test signal provided by an external analog test signal generation device. A second input terminal of the multiplexer 725 receives a transmitter analog test signal.

In this embodiment, some circuit elements in the receiver circuit 710 and the test circuit 720 are the same as those in FIG. 1 and FIG. 3, so that description of these circuit elements may be found with reference to the description of the embodiments of FIG. 1 and FIG. 3 and thus is not repeated herein.

Note that the test circuit 720 of the chip 700 of this embodiment may perform steps S210 to S230 as described in the embodiments of FIG. 2 to achieve DC level testing or may perform steps S410 to S420 as described in the embodiments of FIG. 4 to achieve analog signal testing. The chip 700 of this embodiment may be executed selectively in the DC level test mode or the analog signal test mode. In this regard, specific implementation of the DC level test mode may be found with reference to the description of the embodiments of FIG. 1 and FIG. 2, specific implementation of the analog signal test mode may be found with reference to the description of the embodiments of FIG. 3 and FIG. 4, and description thereof is thus not repeated herein.

Figure 8:
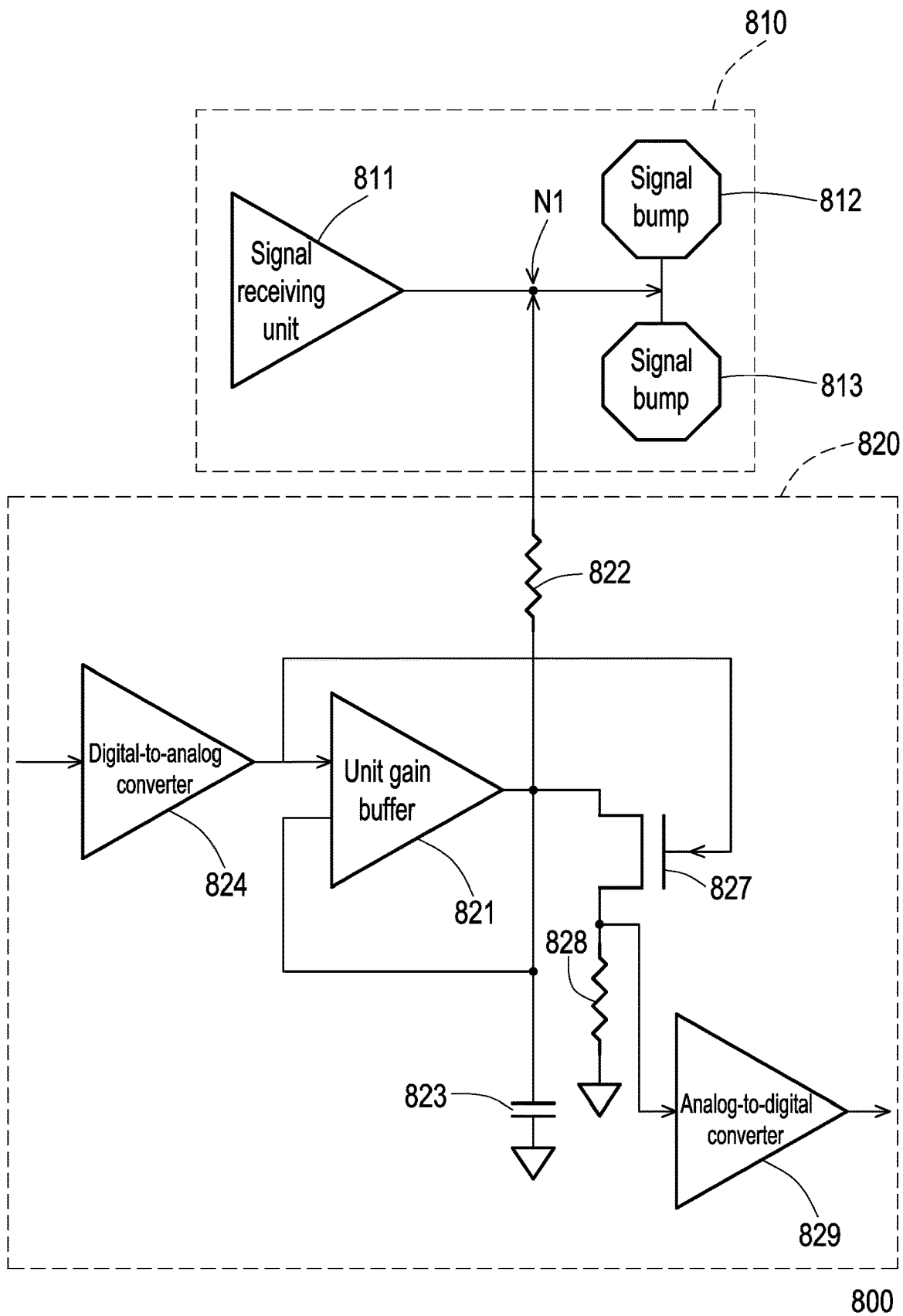
FIG. 8 is a schematic circuit diagram of a chip according to a fifth embodiment of the disclosure.

FIG. 8 is a schematic circuit diagram of a chip according to a fifth embodiment of the disclosure. With reference to FIG. 8, a chip 800 includes a receiver circuit 810 and a test circuit 820. The test circuit 820 may perform electrical testing on the receiver circuit 810. In this embodiment, the receiver circuit 810 includes a signal receiving unit 811 and signal bumps 812 and 813. The signal receiving unit 811 is coupled to the signal bumps 812 and 813. In some embodiments of the disclosure, the receiver circuit 810 may include one signal bump or a plurality of signal bumps, and it is not limited to what is shown in FIG. 8. In this embodiment, the test circuit 820 is coupled to a circuit node N1 between the signal receiving unit 811 and the signal bumps 812 and 813. The test circuit 820 includes a unit gain buffer 821, a first resistor 822, a capacitor 823, a digital-to-analog converter 824, a switch circuit 827, a second resistor 828, and an analog-to-digital converter 829. A first terminal of the first resistor 822 is coupled to the circuit node N1. An output terminal of the unit gain buffer 821 is coupled to a second terminal of the first resistor 822. A first input terminal of the unit gain buffer 821 is coupled to an output terminal of the digital-to-analog converter 824. A second input terminal of the unit gain buffer 821 is coupled to the output terminal of the unit gain buffer 821. A first terminal of the capacitor 823 is coupled to the second terminal of the first resistor 822. A second terminal of the capacitor 823 is coupled to the reference voltage (e.g., the ground terminal voltage). A first terminal of the switch circuit 827 is coupled to the second terminal of the first resistor 822. A control terminal of the switch circuit 827 is coupled to the output terminal of the digital-to-analog converter 824. A first terminal of the second resistor 828 is coupled to a second terminal of the switch circuit 827. A second terminal of the second resistor 828 is coupled to the reference voltage (e.g., the ground terminal voltage). An input terminal of the analog-to-digital converter 829 is coupled to the first terminal of the second resistor 828. The switch circuit 827 may be a switch transistor, but the disclosure is not limited thereto.

In this embodiment, some circuit elements in the receiver circuit 810 and the test circuit 820 are the same as those in FIG. 1 and FIG. 5, so that description of these circuit elements may be found with reference to the description of the embodiments of FIG. 1 and FIG. 5 and thus is not repeated herein.

Note that the test circuit 820 of the chip 800 of this embodiment may perform steps S210 to S230 as described in the embodiments of FIG. 2 to achieve DC level testing or may perform steps S610 to S630 as described in the embodiments of FIG. 6 to achieve leakage current testing. The chip 800 of this embodiment may be executed selectively in the DC level test mode or the leakage current test mode. In this regard, specific implementation of the DC level test mode may be found with reference to the description of the embodiments of FIG. 1 and FIG. 2, specific implementation of the leakage current test mode may be found with reference to the description of the embodiments of FIG. 5 and FIG. 6, and description thereof is thus not repeated herein.

Figure 9:
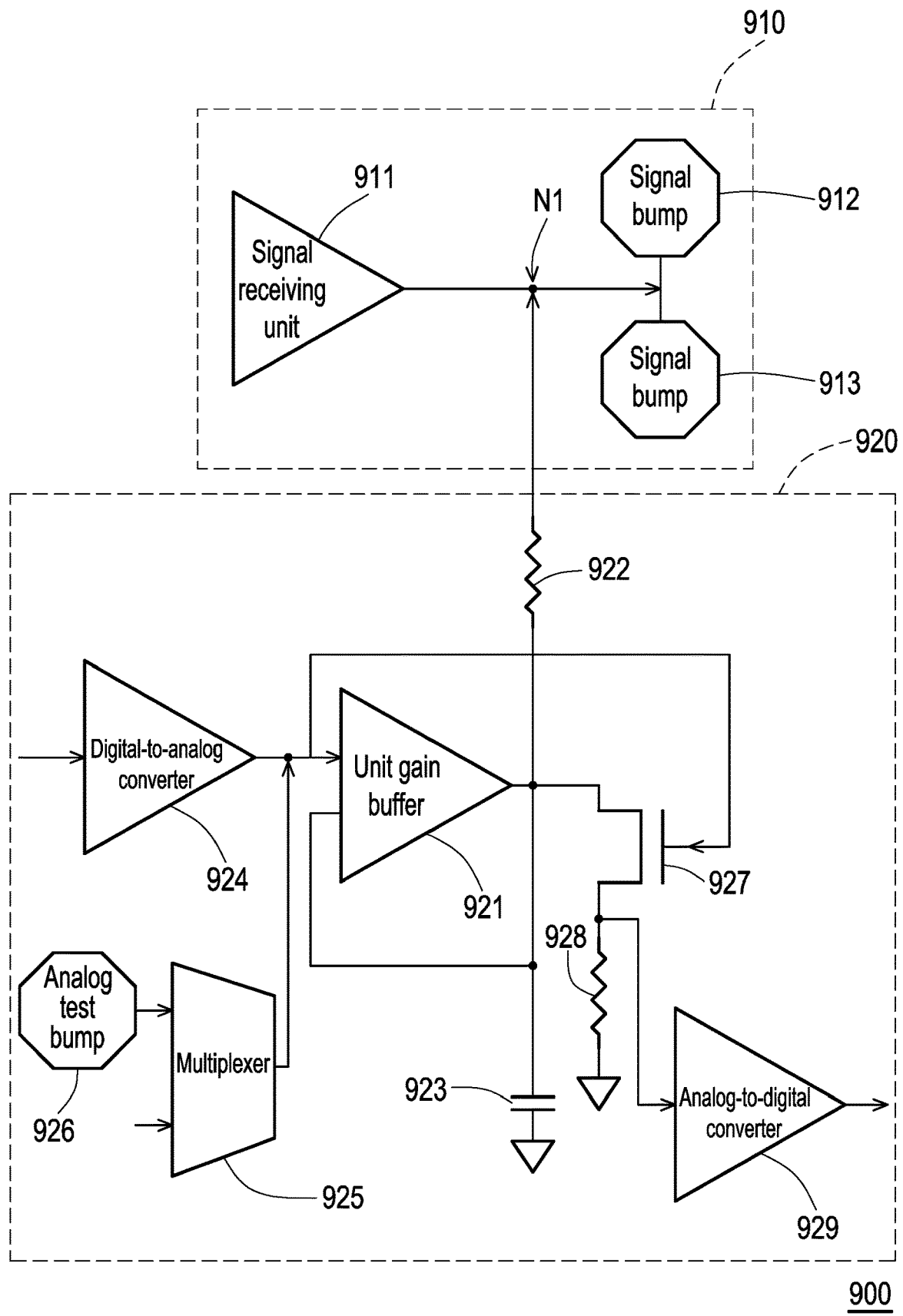
FIG. 9 is a schematic circuit diagram of a chip according to a sixth embodiment of the disclosure.

FIG. 9 is a schematic circuit diagram of a chip according to a sixth embodiment of the disclosure. With reference to FIG. 9, a chip 900 includes a receiver circuit 910 and a test circuit 920. The test circuit 920 may perform electrical testing on the receiver circuit 910. In this embodiment, the receiver circuit 910 includes a signal receiving unit 911 and signal bumps 912 and 913. The signal receiving unit 911 is coupled to the signal bumps 912 and 913. In some embodiments of the disclosure, the receiver circuit 910 may include one signal bump or a plurality of signal bumps, and it is not limited to what is shown in FIG. 9. In this embodiment, the test circuit 920 is coupled to a circuit node N1 between the signal receiving unit 911 and the signal bumps 912 and 913. The test circuit 920 includes a unit gain buffer 921, a first resistor 922, a capacitor 923, a digital-to-analog converter 924, a multiplexer 925, an analog test bump 926, a switch circuit 927, a second resistor 928, and an analog-to-digital converter 929. A first terminal of the first resistor 922 is coupled to the circuit node N1. An output terminal of the unit gain buffer 921 is coupled to a second terminal of the first resistor 922. A first input terminal of the unit gain buffer 921 is coupled to an output terminal of the digital-to-analog converter 924. A second input terminal of the unit gain buffer 921 is coupled to an output terminal of the unit gain buffer 921. A first terminal of the capacitor 923 is coupled to the second terminal of the first resistor 922. A second terminal of the capacitor 923 is coupled to the reference voltage (e.g., the ground terminal voltage). A first terminal of the switch circuit 927 is coupled to the second terminal of the first resistor 922. An output terminal of the multiplexer 925 is coupled to the first input terminal of the unit gain buffer 921. A first input terminal of the multiplexer 925 is coupled to the analog test bump 926, so as to receive a receiver analog test signal provided by an external test signal generation device. A second input terminal of the multiplexer 925 receives a transmitter analog test signal. A control terminal of the switch circuit 927 is coupled to the output terminal of the digital-to-analog converter 924. A first terminal of the second resistor 928 is coupled to a second terminal of the switch circuit 927. A second terminal of the second resistor 928 is coupled to the reference voltage (e.g., the ground terminal voltage). An input terminal of the analog-to-digital converter 929 is coupled to the first terminal of the second resistor 928. The switch circuit 927 may be a switch transistor, but the disclosure is not limited thereto.

In this embodiment, some circuit elements in the receiver circuit 910 and the test circuit 920 are the same as those in FIG. 1. FIG. 3, and FIG. 5, so that description of these circuit elements may be found with reference to the description of the embodiments of FIG. 1. FIG. 3, and FIG. 5 and thus is not repeated herein.

Note that the test circuit 920 of the chip 900 of this embodiment may perform steps S210 to S230 as described in the embodiments of FIG. 2 to achieve DC level testing, may perform steps S410 to S420 as described in the embodiments of FIG. 4 to achieve analog signal testing, or may perform steps S610 to S630 as described in the embodiments of FIG. 6 to achieve leakage current testing. The chip 900 of this embodiment may be executed selectively in the DC level test mode or the leakage current test mode. In this regard, the specific implementation of the DC level test mode may be found with reference to the description of the embodiments of FIG. 1 and FIG. 2, the specific implementation of the analog signal test mode may be found with reference to the description of the embodiments of FIG. 3 and FIG. 4, specific implementation of the leakage current test mode may be found with reference to the description of the embodiments of FIG. 5 and FIG. 6, and description thereof is thus not repeated herein.

In view of the foregoing, in the chip and the chip test method provided by the disclosure, the test circuit may be arranged to be disposed at the signal receiver in the chip, so that the test circuit may perform related electrical testing during the design for testability process of the chip in the manufacturing process. In this way, the probe of an external test apparatus is not required to be adopted to contact and test the signal bumps of the receiver circuit of the chip. Therefore. in the chip and the chip test method provided by the disclosure, the area requirement of the arrangement of the signal bumps at the signal receiver of the chip may be effectively lowered, the influence of parasitic capacitance may be reduced, and the signal transmission speed of the chip may be further improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A chip, comprising:
a receiver circuit, comprising:
a signal receiving unit; and
a signal bump, coupled to the signal receiving unit; and
a test circuit, coupled to a circuit node between the signal receiving unit and the signal bump, the test circuit comprising:
a digital-to-analog converter;
a first resistor, wherein a first terminal of the first resistor is coupled to the circuit node; and
a unit gain buffer, wherein an output terminal of the unit gain buffer is coupled to a second terminal of the first resistor, a first input terminal of the unit gain buffer is coupled to an output terminal of the digital-to-analog converter, and a second input terminal of the unit gain buffer is coupled to the output terminal of the unit gain buffer.

2. The chip according to claim 1, wherein the output terminal of the digital-to-analog converter outputs a first direct current level test signal to the first input terminal of the unit gain buffer when an input terminal of the digital-to-analog converter receives a digital test signal,
wherein the output terminal of the unit gain buffer outputs a second direct current level test signal, so that the signal receiving unit receives the second direct current level test signal through the circuit node.

3. The chip according to claim 1, wherein the output terminal of the unit gain buffer outputs a second analog test signal when the first input terminal of the unit gain buffer receives a first analog test signal, and the signal receiving unit receives the second analog test signal through the circuit node.

4. The chip according to claim 3, wherein the test circuit further comprises:
a multiplexer, wherein an output terminal of the multiplexer is coupled to the first input terminal of the unit gain buffer, a first input terminal of the multiplexer is coupled to an analog test bump to receive a receiver analog test signal, and a second input terminal of the multiplexer receives a transmitter analog test signal,
wherein the multiplexer determines to output the receiver analog test signal or the transmitter analog test signal to act as the first analog test signal according to a switching signal.

5. The chip according to claim 4, wherein the test circuit further comprises:
a switch circuit, wherein a first terminal of the switch circuit is coupled to the second terminal of the first resistor, and a control terminal of the switch circuit is coupled to the output terminal of the digital-to-analog converter;
a second resistor, wherein a first terminal of the second resistor is coupled to a second terminal of the switch circuit, and a second terminal of the second resistor is coupled to a first reference voltage; and
an analog-to-digital converter, wherein an input terminal of the analog-to-digital converter is coupled to the first terminal of the second resistor.

6. The chip according to claim 5, wherein the output terminal of the digital-to-analog converter outputs an analog turning-on signal to the control terminal of the switch circuit to turn on the switch circuit when an input terminal of the digital-to-analog converter receives a digital turning-on signal,
wherein the first terminal of the switch circuit receives a leakage current signal flowing through the circuit node, so that the analog-to-digital converter outputs a digital test signal from an output terminal of the analog-to-digital converter according to the leakage current signal.

7. The chip according to claim 5, wherein the switch circuit is a switch transistor.

8. The chip according to claim 1, wherein the test circuit further comprises:
a switch circuit, wherein a first terminal of the switch circuit is coupled to the second terminal of the first resistor, and a control terminal of the switch circuit is coupled to the output terminal of the digital-to-analog converter;
a second resistor, wherein a first terminal of the second resistor is coupled to a second terminal of the switch circuit, and a second terminal of the second resistor is coupled to a first reference voltage; and
an analog-to-digital converter, wherein an input terminal of the analog-to-digital converter is coupled to the first terminal of the second resistor.

9. The chip according to claim 8, wherein the output terminal of the digital-to-analog converter outputs an analog turning-on signal to the control terminal of the switch circuit to turn on the switch circuit when an input terminal of the digital-to-analog converter receives a digital turning-on signal,
    wherein the first terminal of the switch circuit receives a leakage current signal flowing through the circuit node, so that the analog-to-digital converter outputs a digital test signal from an output terminal of the analog-to-digital converter according to the leakage current signal.

10. The chip according to claim 8, wherein the switch circuit is a switch transistor.

11. The chip according to claim 1, wherein the test circuit further comprises:
    a capacitor, wherein a first terminal of the capacitor is coupled to the second terminal of the first resistor, and a second terminal of the capacitor is coupled to a second reference voltage.

12. The chip according to claim 1, wherein a first input terminal of the signal receiving unit is coupled to the signal bump through the circuit node, and a second input terminal of the signal receiving unit is coupled to another signal bump through another circuit node, wherein the chip further comprises another test circuit, and the another test circuit is coupled to the another circuit node.

13. The chip according to claim 12, wherein the signal receiving unit receives a differential test signal or a common mode test signal through the first input terminal and the second input terminal when the test circuit and the another test circuit perform test operations.

14. The chip according to claim 1, wherein a number of the first signal bump is one or more.

15. A chip test method, wherein the chip comprises a receiver circuit and a test circuit, the receiver circuit comprises a signal receiving unit and a signal bump, the signal receiving unit is coupled to the signal bump, the test circuit is coupled to a circuit node between the signal receiving unit and the signal bump, the test circuit comprises an analog-to-digital converter, a first resistor, and a unit gain buffer, a first terminal of the first resistor is coupled to the circuit node, an output terminal of the unit gain buffer is coupled to a second terminal of the first resistor, a first input terminal of the unit gain buffer is coupled to an output terminal of the analog-to-digital converter, a second input terminal of the unit gain buffer is coupled to the output terminal of the unit gain buffer, and the chip test method comprises:
    outputting, by the output terminal of the analog-to-digital converter, a first direct current level test signal to the first input terminal of the unit gain buffer when an input terminal of the analog-to-digital converter receives a digital test signal;
    outputting, by the output terminal of the unit gain buffer, a second direct current level test signal; and
    receiving, by the signal receiving unit, the second direct current level test signal through the circuit node.

16. The chip test method according to claim 15, further comprising:
    outputting, by the output terminal of the unit gain buffer, a second analog test signal when the first input terminal of the unit gain buffer receives a first analog test signal; and
    receiving, by the signal receiving unit, the second analog test signal through the circuit node.

17. The chip test method according to claim 16, wherein the test circuit further comprises a multiplexer, an output terminal of the multiplexer is coupled to the first input terminal of the unit gain buffer, and the chip test method further comprises:
    receiving, by a first input terminal of the multiplexer being coupled to an analog test bump, a receiver analog test signal;
    receiving, by a second input terminal of the multiplexer, a transmitter analog test signal; and
    determining, by the multiplexer, to output the receiver analog test signal or the transmitter analog test signal to act as the first analog test signal according to a switching signal.

18. The chip test method according to claim 17, wherein the test circuit further comprises a switch circuit, a second resistor, and an analog-to-digital converter, a first terminal of the switch circuit is coupled to the second terminal of the first resistor, a control terminal of the switch circuit is coupled to the output terminal of the digital-to-analog converter, a first terminal of the second resistor is coupled to a second terminal of the switch circuit, a second terminal of the second resistor is coupled to a first reference voltage, an input terminal of the analog-to-digital converter is coupled to the first terminal of the second resistor, the chip test method further comprises:
    outputting, by the output terminal of the digital-to-analog converter, an analog turning-on signal to the control terminal of the switch circuit to turn on the switch circuit when an input terminal of the digital-to-analog converter receives a digital turning-on signal;
    receiving, by the first terminal of the switch circuit, a leakage current signal flowing through the circuit node; and
    outputting, by the analog-to-digital converter, a digital test signal from an output terminal of the analog-to-digital converter according to the leakage current signal.

19. The chip test method according to claim 16, wherein the test circuit further comprises a switch circuit, a second resistor, and an analog-to-digital converter, a first terminal of the switch circuit is coupled to the second terminal of the first resistor, a control terminal of the switch circuit is coupled to the output terminal of the digital-to-analog converter, a first terminal of the second resistor is coupled to a second terminal of the switch circuit, a second terminal of the second resistor is coupled to a first reference voltage, an input terminal of the analog-to-digital converter is coupled to the first terminal of the second resistor, the chip test method further comprises:
    outputting, by the output terminal of the digital-to-analog converter, an analog turning-on signal to the control terminal of the switch circuit to turn on the switch circuit when an input terminal of the digital-to-analog converter receives a digital turning-on signal;
    receiving, by the first terminal of the switch circuit, a leakage current signal flowing through the circuit node; and
    outputting, by the analog-to-digital converter, a digital test signal from an output terminal of the analog-to-digital converter according to the leakage current signal.

20. The chip test method according to claim 15, wherein a first input terminal of the signal receiving unit is coupled to the signal bump through the circuit node, and a second input terminal of the signal receiving unit is coupled to another signal bump through another circuit node, the chip further comprises another test circuit, the another test circuit is coupled to the another circuit node, and the chip test method further comprises:
    receiving, by the signal receiving unit, a differential test signal or a common mode test signal through the first input terminal and the second input terminal when the test circuit and the another test circuit perform test operations.

* * * * *